(12) United States Patent
Lin

(10) Patent No.: US 7,034,724 B2
(45) Date of Patent: Apr. 25, 2006

(54) TRAINING CIRCUIT AND METHOD OF DIGITAL-ANALOG CONVERTER AND ANALOG-DIGITAL CONVERTER

(75) Inventor: Chin-Lung Lin, Hsinchu (TW)

(73) Assignee: Prolific Technology Inc., Taipei (TW)

( * ) Notice: Subject to any disclaimer, the term of this patent is extended or adjusted under 35 U.S.C. 154(b) by 0 days.

(21) Appl. No.: 10/904,545

(22) Filed: Nov. 16, 2004

(65) Prior Publication Data

US 2005/0116845 A1  Jun. 2, 2005

(30) Foreign Application Priority Data

Nov. 28, 2003  (TW) ............................... 92133509 A

(51) Int. Cl.
*H03M 1/00* (2006.01)
(52) U.S. Cl. ........................ 341/126; 341/120; 341/118
(58) Field of Classification Search ................ 341/144, 341/145, 155, 156, 118, 120, 122, 164, 150, 341/172, 126
See application file for complete search history.

(56) References Cited

U.S. PATENT DOCUMENTS

| | | | | |
|---|---|---|---|---|
| 4,381,495 A | * | 4/1983 | Hotta et al. ................ | 341/120 |
| 4,407,020 A | * | 9/1983 | Helliwell et al. ........... | 370/533 |
| 4,415,882 A | * | 11/1983 | Akazawa et al. ........... | 341/156 |
| 4,496,937 A | * | 1/1985 | Kitagawa et al. ........... | 341/110 |
| 5,184,131 A | * | 2/1993 | Ikeda ........................ | 341/165 |

* cited by examiner

*Primary Examiner*—John B Nguyen
(74) *Attorney, Agent, or Firm*—Jiang Chyun IP Office

(57) ABSTRACT

A training method of a digital-analog converter is provided. The digital-analog converter comprises a plurality of parallel capacitors, each of which is floatingly coupled to a plurality of correcting capacitors. Two voltages outputted from the digital-analog converter are received and compared. When a latter output voltage is lower than or equal to a former output voltage, the correcting capacitor is used to correct the capacitor corresponding to the latter output voltage until the latter output voltage is higher than the former output voltage. When the latter output voltage is higher than the former output voltage, a new voltage is outputted from the digital-analog convert and compared with the latter output voltage. The steps of comparing and correcting are repeated until every latter output voltage is higher than every former output voltage.

6 Claims, 3 Drawing Sheets

TRAINING CIRCUIT AND METHOD OF DIGITAL-ANALOG CONVERTER AND ANALOG-DIGITAL CONVERTER

CROSS-REFERENCE TO RELATED APPLICATION

This application claims the priority benefit of Taiwan application Serial no. 92133509, filed Nov. 28, 2003.

BACKGROUND OF THE INVENTION

1. Field of the Invention

The present invention relates to a digital-analog converter, and more particularly, to a training circuit and method of a digital-analog converter and an analog-digital converter.

2. Description of the Related Art

Modern portable electronic devices, such as personal digital assistants (PDAs), cellular phones or electronic translators, have touch screens for a writing-data input mode. Touch screens use analog-digital converters to transfer the analog signals inputted by writing into digital signals, which are then processed by processors.

Circuits of analog-digital converters comprise digital-analog converters, which is constituted by parallel capacitors. With the increasing of bits of electronic devices, the capacitance required of the capacitors in the digital-analog converter also rises. High capacitance, however, brings in bad resolution of the analog-digital converter. In order to maintain the resolution of the analog-digital converter, correcting capacitors, which are parallel connected to the existing capacitors, are added in the circuit of the digital-analog converter. After a training process, the required number of the correcting capacitors can be obtained.

FIG. 1 is a schematic drawing showing a capacitance-correcting circuit of a conventional digital-analog converter. As shown in FIG. 1, within the limitation of the resolution, the capacitance of the parallel capacitors has a geometric-series relationship, such as C, 2C, $2^2$C, . . . $2^7$C. If the capacitance of the capacitor is too high, a set of parallel correcting capacitors 104 is series connected thereto, and then the capacitor 100, which has a descending geometric series relationship, is parallel connected thereto. The capacitor 100 is parallel coupled to the correcting capacitors 102. After the training process, the required number of the correcting capacitors 102 is obtained by a trial-and-error method. The routes of the redundant correcting capacitors are fused by laser or other methods.

When the number of the capacitors 100 increases, the time required for the trial-and-error method is long. In addition, the fusing location X for the correcting capacitors is predetermined during the fabrication process. If the fabrication process is unstable, the yield of the digital-analog converters will decline and the manufacturing costs will increase.

SUMMARY OF THE INVENTION

Therefore, the present invention is directed to a training circuit of a digital-analog converter to prevent low yield due to an unstable fabrication process.

The present invention is also directed to an analog-digital converter which has better resolution.

The present invention is also directed to a training method for various digital-analog converters.

In order to achieve the objects described above, the present invention provides a training circuit of a digital-analog converter, the training circuit comprises a digital-analog converter, a sampling/holding switching circuit, a comparator, a counter, a selector and a plurality of capacitance-correcting counters. Wherein, the digital-analog converter comprises a plurality of capacitance-correcting circuits, each of which comprises a capacitor and a plurality of correcting capacitors parallel connected thereto, wherein each correcting capacitor is coupled to a switch. The sampling/holding switching circuit is coupled to the digital-analog converter to sample and hold a voltage outputted from the digital-analog converter. The comparator comprises two input terminals which are coupled to output terminals of the sampling/holding switching circuit respectively to compare the voltage outputted from the digital-analog converter with a next voltage so as to output a comparison signal.

The counter is coupled to the comparator and the digital-analog converter to receive the comparison signal outputted from the comparator. According to the comparison signal, the counter generates a counting value to the digital-analog converter. When the comparison signal is at a first level, 1 is added to the counting value so that the digital-analog converter outputs the voltage accordingly. When the comparison signal is at a second level, the counter stops, and the comparator is enabled. The selector is coupled to the comparator to receive the comparison signal, and coupled to the counter to receive a selecting signal.

The capacitance-correcting counters are coupled to the selector, the counter and the digital-analog converter, and correspond to the capacitance-correcting circuits respectively. When the comparison signal is at the second level, the selector selects one of the capacitance-correcting counters to correct a capacitance-correcting circuit corresponding thereto according to the selecting signal. When the comparison signal is at the first level, the selected capacitance-correcting counter stops and 1 is added to the counting value.

The present invention also provides an analog-digital converter, which comprises a comparator, a success approximation register (SAR) algorithm device and a digital-analog converter. The comparator has a first input terminal, a second input terminal and an output terminal, wherein the first input terminal receives an analog signal. The SAR algorithm device is connected to the output terminal of the comparator. The digital-analog converter is connected to the second input terminal of the comparator and an output terminal of the SAR algorithm device.

The present invention further discloses a training method for a digital-analog converter, wherein the digital-analog converter comprises a plurality of parallel capacitors, each of which are floatingly coupled to a plurality of correcting capacitors. The training method starts by receiving a first output voltage from the digital-analog converter. A second output voltage is then received from the digital-analog converter. Next, the second output voltage and the first output voltage are compared. When the second output voltage is higher than the first output voltage, a third output voltage is outputted, and the third output voltage and the second output voltage are compared. When the second output voltage is lower than the first output voltage, the correcting capacitors are sequentially coupled to the capacitor corresponding to the second output voltage until the second output voltage is higher than the first output voltage.

Since the digital-analog converter in the present invention uses the switch to control the routes of the correcting capacitors, the low yield due to an unstable fabrication processes can be improved and costs are thus reduced. Moreover, the training method of the digital-analog converter in the present invention can perform automatic test. The testing time in the present invention is far less than required in the conventional method.

In addition, the training method of the present invention can be used in various digital-analog converters. After the training method in the present invention, the screen-touch analog-digital converter using the digital-analog converter according to the present invention will have better resolution.

In order to make the aforementioned and other objects, features and advantages of the present invention understandable, embodiments accompanied with figures are described in detail below.

DESCRIPTION OF THE EMBODIMENTS

What follows is the description of a 4-bit digital-analog converter according to one embodiment of the present invention.

Figure 1:
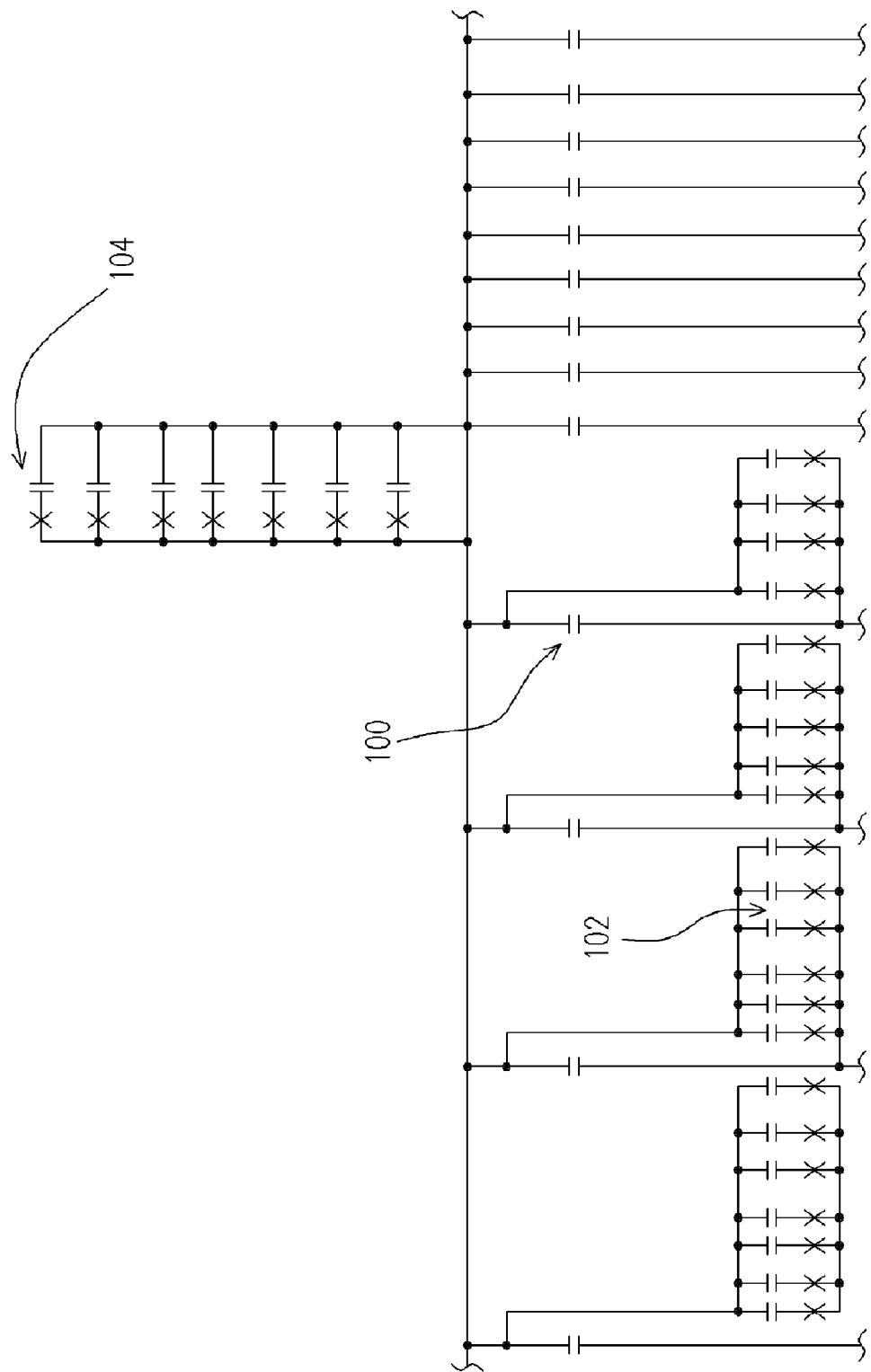
FIG. 1 is a schematic drawing showing a capacitance-correcting circuit of a conventional digital-analog converter.
Figure 2:
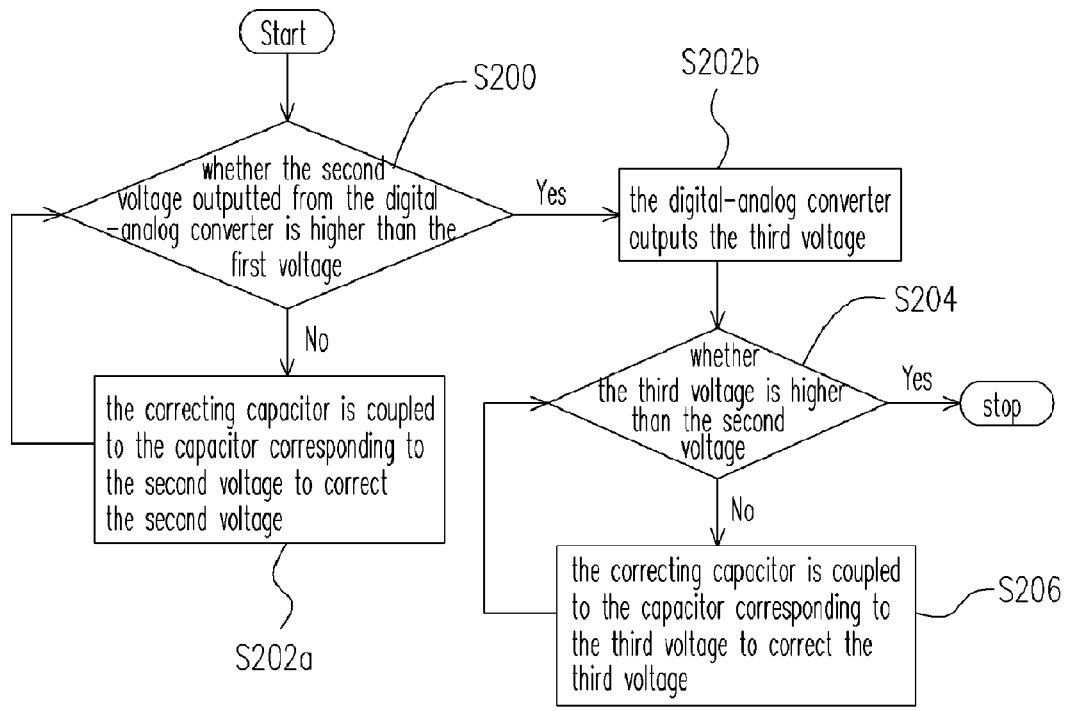
FIG. 2 is a flowchart showing a training method of a digital-analog converter according to the present invention.

FIG. 2 is a flowchart showing a training method of a digital-analog converter according to the present invention. In this embodiment, the digital-analog converter is constituted by parallel capacitors. With reference to FIG. 2, in step S200, the first and the second voltages outputted from the digital-analog converter sequentially is compared to generate a comparison signal. The comparison signal is then transmitted to the digital-analog converter. In this embodiment, the first voltage is an analog voltage corresponding to 0000, and the second voltage is an analog voltage corresponding to 0001. When the second voltage is not higher than the first voltage, step S202a is performed. In step S202a, the correcting capacitors are sequentially coupled to the capacitor corresponding to the second voltage to correct the second voltage. Then the step S200 is repeated where the corrected second voltage is compared with the first voltage. The steps S200 and S202a are repeated until the second voltage is higher than the first voltage.

When the second voltage is higher than the first voltage, the digital-analog converter outputs a third voltage, such as an analog voltage corresponding to 0010, in the step S202b. In step 204, the third voltage is compared with the second voltage. When the third voltage is lower than or equal to the second voltage, the correcting capacitors are sequentially coupled to the capacitor corresponding to the third voltage to correct the third voltage in step S206. Then the step S204 is repeated where the corrected third voltage is compared with the second voltage. The steps S204 and S206 are repeated until the third voltage is higher than the second voltage. After all output voltages of the digital-analog converter go through the training steps described above, the training method of the digital-analog converter is completed.

In order to achieve the training method of the digital-analog converter, the present invention discloses a training circuit of the digital-analog converter. What follows is the detailed description.

Figure 3:
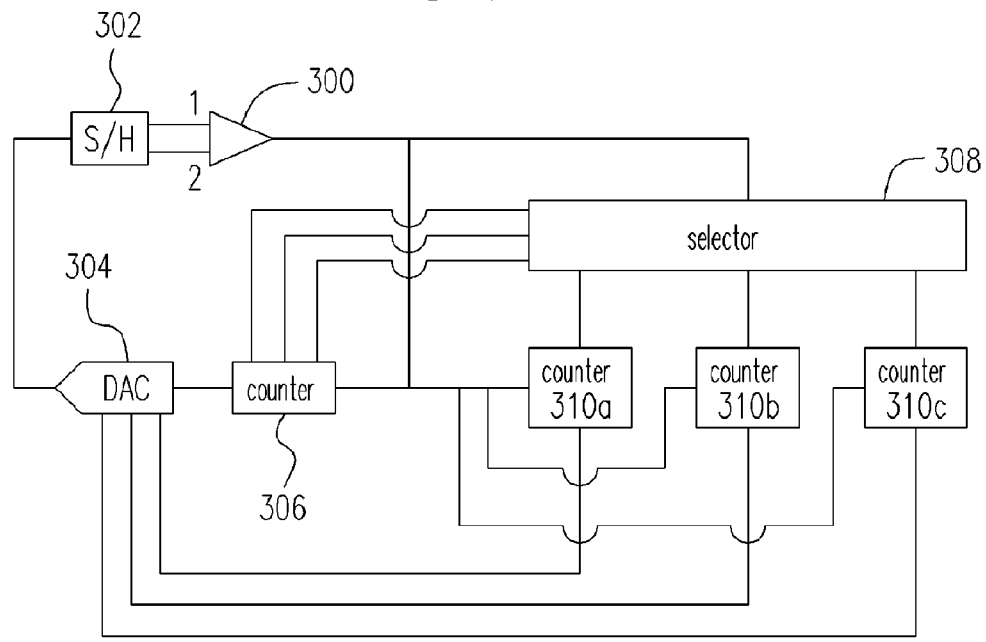
FIG. 3 is a block diagram showing a training circuit of a digital-analog converter according to an embodiment of the present invention.
Figure 4:
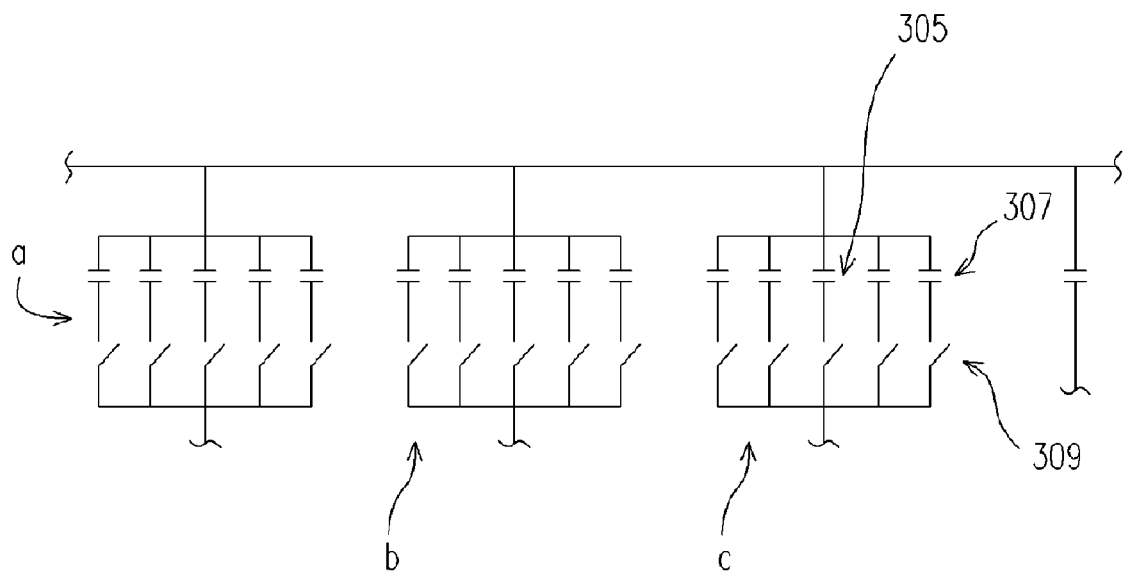
FIG. 4 is a schematic drawing showing a capacitance-correcting circuit of the digital-analog converter 304 according to the present invention.

FIG. 3 is a block diagram showing a training circuit of a digital-analog converter according to an embodiment of the present invention. FIG. 4 is a schematic drawing showing a capacitance-correcting circuit of the digital-analog converter 304 according to the present invention.

With reference to FIG. 3, the training circuit comprises a comparator 300, a sampling/holding switching circuit 302, a digital-analog converter 304, a counter 306, a selector 308 and capacitance-correcting counters 310a, 310b and 310c. The digital-analog converter 304 comprises a plurality of parallel capacitors and a plurality of capacitance-correcting circuits.

With reference to FIG. 4, the digital-analog converter 304 is constituted by parallel capacitors 305. The capacitance-correcting circuits a, b and c comprise a plurality of correcting capacitors 307, which are parallel coupled to the capacitors 305. Each of the correcting capacitors 307 is coupled to a switch 309. The switch 309 controls the connection between the correcting capacitor 307 and the capacitor 305.

With reference to FIG. 3, the comparator 300 comprises an input terminal 1, an input terminal 2 and an output terminal. The input terminals 1 and 2 are coupled to the sampling/holding switching circuit 302 respectively. The output terminal of the comparator 300 is coupled to the counter 306 and the selector 308. The input terminal of the sampling/holding switching circuit 302 is coupled to the output terminal of the digital-analog converter 304 to receive the voltage outputted therefrom. The sampling/holding switching circuit 302 further comprises a sampling/holding circuit and a switching circuit. The sampling/holding circuit samples and holes the voltage outputted from the digital-analog converter 304. The switching circuit alternatively switches the input terminals of the comparator 300 to the positive input terminal.

The counter 306 is coupled to the comparator 300 and the digital-analog converter 304 to receive the comparison signal outputted from the comparator 300. According to the comparison signal, the counter 306 generates a counting value to the digital-analog converter 304.

The selector 308 is coupled to the comparator 300 and the counter 306 to receive the comparison signal outputted from the comparator 300 and the selecting signal outputted from the counter 306 respectively. The output terminal of the selector 308 is coupled to the capacitance-correcting counters 310a, 310b and 310c, respectively. The capacitance-correcting counters 310a, 310b and 310c are coupled to the digital-analog converter 304, corresponding to the capacitance-correcting circuits a, b and c, respectively.

In the training circuit of the digital-analog converter of the present invention, the digital-analog converter 304 outputs two voltages which are compared by the comparator 300. For example, the digital-analog converter 304 outputs an analog voltage, such as an analog voltage corresponding to 0001, which is held by the sampling/holding switching circuit 302, in one period. In the next period, the analog voltage held by the sampling/holding switching circuit 302 is outputted to the input terminal 1 of the comparator 300, which is compared with the analog voltage corresponding to 0000 by the comparator 300. In the next period, the analog voltage corresponding to 0010 is sampled by the sampling/holding switching circuit 302 and held at the input terminal 2 of the comparator 300. The input terminal 2 is switched to the positive input terminal. When the later output voltage is lower than or equal to the first output voltage, the counter 306 stops. A selecting signal is transmitted to the selector 308, which is enabled. According to the selecting signal, the selector 308 selects and triggers one of the capacitance-correcting counters 310a, 310b and 310c to correct the capacitance-correcting circuits corresponding to the capacitance-correcting counters 310a, 310b and 310c. With reference to FIG. 4, the capacitance-correcting counters 310a, 310b and 310c control the switches 309 in response to the connection of the correcting capacitors 307 and the capacitors 305. The corrected voltage is then applied to the comparator 300 to compare with the first output voltage. These steps are repeated until the corrected voltage is higher than the first output voltage.

When the corrected voltage is higher than the first output voltage, the comparison signal is transmitted to the counter 306 to generate a counting value which is created by adding 1 to the last counting value. According to the counting value, the digital-analog converter 304 outputs a new voltage. The comparator 300 then compares the new output voltage with the last output voltage. If the new output voltage is lower than or equal to the last output voltage, the correcting steps are repeated. The counter 306 outputs a selecting signal. According to the selecting signal, the selector 308 selects and triggers one of the capacitance-correcting counters 310a, 310b and 310c to correct the capacitance-correcting circuits corresponding to the capacitance-correcting counters 310a, 310b and 310c. When the new output voltage is higher than the last output voltage, the next operation is performed. By repeating these steps until all correction of the capacitors is finished, the training operation of the digital-analog converter then stops.

Though the 4-bit digital-analog converter is illustrated in this embodiment, the training method of the digital-analog converter can be used in other digital-analog converters with different bits. The bits of the digital-analog converter according to the present invention are not specified. In the training circuit of the digital-analog converter, the number of the capacitance-correcting counters can be modified with the number of capacitors in the digital-analog converter that are going to be trained. As a result, every capacitance-correcting circuit of the digital-analog converter corresponds to a capacitance-correcting counter.

Figure 5:
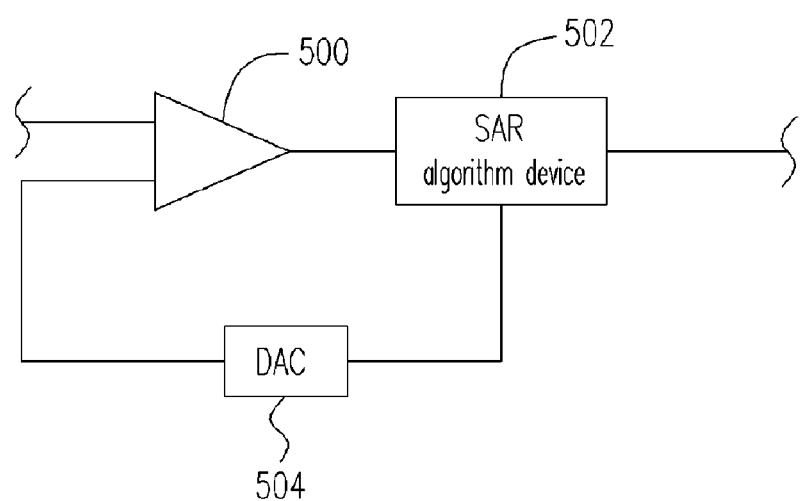
FIG. 5 is a block diagram showing an analog-digital converter according to an embodiment of the present invention.

FIG. 5 is a block diagram showing an analog-digital converter according to an embodiment of the present invention. With reference to FIG. 5, the analog-digital converter comprises a comparator 500, a success approximation register (SAR) algorithm device 502 and a digital-analog converter 504. The comparator 500 has a first input terminal, a second input terminal and an output terminal. The first and the second input terminals receive analog signals respectively. One of the received analog signals is used as a standard analog signal for comparing with another analog signal. Wherein, the digital signals corresponding to the standard analog signals are known.

The input terminal of the SAR algorithm device 502 is coupled to the output terminal of the comparator 500 to receive the comparison results so as to obtain the digital signal corresponding to another analog signal. The obtained digital signal is then outputted from the output terminal of the SAR algorithm device 502. The SAR algorithm device 502 also transmits the obtained digital signal to the digital-analog converter 504. The digital-analog converter 504 transforms the obtained digital signal into an analog signal and feeds back the analog signal to the comparator 500 as a basis for next comparison of analog signals. By repeating these operating steps, all analog signals are transformed into digital signals.

By correcting the internal capacitances using the said training method, the digital-analog converter 504 is able to improve the resolution of the analog-digital converter.

Accordingly, the digital-analog converter of the present invention uses the switch to control the connection of the correcting capacitors. Therefore, the low yield due to an unstable fabrication processes can be prevented and costs are thus reduced. Moreover, the training method of the digital-analog converter of the present invention can perform automatic test. The testing time in the present invention is far less than required in the conventional method.

In addition, the training method of the present invention can be used in various digital-analog converters. After the training process, the screen-touch analog-digital converter using the digital-analog converter according to the present invention will have better resolution.

Although the present invention has been described in terms of exemplary embodiments, it is not limited thereto. Rather, the appended claims should be constructed broadly to include other variants and embodiments of the invention which may be made by those skilled in the field of this art without departing from the scope and range of equivalents of the invention.

What is claimed is:

1. A training circuit of a digital-analog converter, comprising:
   a digital-analog converter, comprising a plurality of capacitance-correcting circuits;
   a sampling/holding switching circuit coupled to the digital-analog converter to sample and hold an voltage outputted from the digital-analog converter;
   a comparator, having two input terminals coupled to output terminals of the sampling/holding switching circuit respectively to compare the voltage outputted from the digital-analog converter with a next voltage so as to output a comparison signal;
   a counter coupled to the comparator and the digital-analog converter to receive the comparison signal outputted from the comparator, according to the comparison signal, generating a counting value to the digital-analog converter, wherein when the comparison signal is at a first level, 1 is added to the counting value so that the digital-analog converter outputs the voltage accordingly, and when the comparison signal is at a second level, the counter stops;
   a selector coupled to the comparator to receive the comparison signal, and coupled to the counter to receive a selecting signal, wherein when the comparison signal is at the second level, the selector is enabled; and
   a plurality of capacitance-correcting counters coupled to the selector, the counter and the digital-analog converter respectively, corresponding to the capacitance-correcting circuits, wherein when the comparison signal is at the second level, the selector selects one of the capacitance-correcting counters to correct a capacitance-correcting circuit corresponding thereto according to the selecting signal, and when the comparison signal is at the first level, the selected capacitance-correcting counter stops and 1 is added to the counting value of the counter.

2. The training circuit of a digital-analog converter of claim 1, wherein the digital-analog converter comprises a plurality of parallel capacitors, and the capacitance-correcting circuits comprise a plurality of correcting capacitors parallel coupled to the capacitors and a plurality of switches coupled to the correcting capacitors.

3. The training circuit of a digital-analog converter of claim 2, wherein the switches of the capacitance-correcting circuits are turned on according to the counting values outputted front the capacitance-correcting counters.

4. The training circuit of a digital-analog converter of claim 1, wherein the sampling/holding switching circuit further comprises a sampling/holding circuit to sample and hold the voltage outputted from the digital-analog converter, and a switching circuit to alternatively switch the two input terminals to a positive input terminal.

5. An analog-digital converter, comprising:
  a comparator comprising a first input terminal, a second input terminal and an output terminal, wherein the first input terminal receives an analog signal;
  a success approximation register (SAR) algorithm device coupled to the output terminal of the comparator; and
  a digital-analog convener connected between the second input terminal of the comparator and the output terminal of the SAR algorithm device, wherein the digital-analog converter comprising the training circuit, which is any of the training circuits as claimed in claims 1–4.

6. A training method for a digital-analog converter, wherein the digital-analog converter comprises a plurality of parallel capacitors, and the capacitors are floatingly coupled to a plurality of correcting capacitors, the training method comprising:
  receiving a first output voltage from the digital-analog converter;
  receiving a second output voltage from the digital-analog converter;
  comparing the second output voltage with the first output voltage;
  outputting a third output voltage when the second output voltage is higher than the first output voltage, and comparing the third output voltage with the second output voltage; and
  sequentially coupling the correcting capacitors to the capacitor corresponding to the second output voltage when the second output voltage is lower than or equal to the first output voltage until the second output voltage is higher than the first output voltage.

* * * * *